United States Patent

Geissler et al.

[11] Patent Number: 5,448,090
[45] Date of Patent: Sep. 5, 1995

[54] STRUCTURE FOR REDUCING PARASITIC LEAKAGE IN A MEMORY ARRAY WITH MERGED ISOLATION AND NODE TRENCH CONSTRUCTION

[75] Inventors: Stephen F. Geissler, Underhill; David K. Lloyd, South Burlington; Matthew Paggi, Shelburne, all of Vt.

[73] Assignee: International Business Machines Corporation, Armonk, N.Y.

[21] Appl. No.: 285,480

[22] Filed: Aug. 3, 1994

[51] Int. Cl.⁶ .............................. H01L 29/76
[52] U.S. Cl. .................. 257/305; 257/301; 257/394; 257/519
[58] Field of Search ............... 257/301, 305, 519, 652

[56] References Cited

U.S. PATENT DOCUMENTS

| | | | |
|---|---|---|---|
| 3,873,371 | 3/1975 | Wolf | 148/1.5 |
| 4,801,988 | 1/1989 | Kenney | 257/305 |
| 4,918,027 | 4/1990 | Fuse et al. | 437/35 |
| 4,922,313 | 5/1990 | Tsuchiya | 257/301 |
| 4,969,022 | 11/1990 | Nishimoto et al. | 257/301 |
| 5,021,355 | 6/1991 | Dhong et al. | 437/35 |
| 5,041,887 | 8/1991 | Kumagai et al. | 257/305 |
| 5,047,359 | 9/1991 | Nagatomo | 437/35 |
| 5,112,762 | 5/1992 | Anderson et al. | 437/35 |
| 5,240,874 | 9/1993 | Roberts | 437/69 |
| 5,248,894 | 9/1993 | Beasom | 257/519 |

FOREIGN PATENT DOCUMENTS 52-72585  6/1977  Japan.

OTHER PUBLICATIONS

Soychak, F. J. et al., "Technique to Selectively Dope Semiconductor Trench Walls and Bottom," IBM Technical Disclosure Bulletin, vol. 30, No. 8, pp. 268–269, Jan. 1988.

*Primary Examiner*—Robert P. Limanek
*Attorney, Agent, or Firm*—Heslin & Rothenberg

[57] ABSTRACT

A semiconductor structure of merged isolation and node trench construction is presented, along with a method of fabrication, wherein an isolation implant layer is formed at the intersection of the storage node, isolation trench and field isolation region. The isolation implant layer has higher concentration of implant species than the adjacent field isolation region and is positioned to prevent a parasitic leakage mechanism between the source/drain diffusion of the storage node and an adjacent bit line contact diffusion. Implantation occurs during memory structure fabrication through the deep trench sidewall near the upper surface of the substrate.

21 Claims, 9 Drawing Sheets fig. 1a
(PRIOR ART)

STRUCTURE FOR REDUCING PARASITIC LEAKAGE IN A MEMORY ARRAY WITH MERGED ISOLATION AND NODE TRENCH CONSTRUCTION

TECHNICAL FIELD

The present invention relates to a semiconductor memory structure with merged isolation trench and node trench construction having reduced parasitic charge leakage, and to a method of fabricating the same.

BACKGROUND ART

Although metal-oxide-silicon field-effect transistors (MOSFETs) are fabricated within a common silicon substrate, they must nevertheless be electrically isolated from one another. Once isolated, the MOSFETs can then be interconnected to create specific circuitry configurations.

MOSFETs are said to be "self-isolated;" that is, as long as the source-substrate and drain-substrate pn junctions are held at reverse bias, drain current is due only to current flow from source to drain through a channel under the gate. However, the conducting lines used to interconnect metal-oxide-semiconductor (MOS) transistors often form gates of parasitic MOS transistors within the common silicon substrate, with the oxide beneath them forming an undesired gate oxide. To isolate MOSFETs, therefore, it is necessary to prevent the formation of channels in the field regions. One way to accomplish this is to utilize a comparatively thick field oxide layer. However, as device dimensions continue to shrink, thick field oxide regions become undesirable.

Another transistor isolation technique is to raise the dopant level in the substrate beneath the field oxide to increase the parasitic gate turn-on voltage. This is typically accomplished by ion implantation to create what are referred to in the art as "field isolation regions" or "channel stop regions." The combination of field oxide and a channel stop region can provide adequate isolation for most PMOS, NMOS and oxide-isolated bipolar integrated circuits. However, the formation of channel stop regions in certain applications is not without drawbacks.

Figure 1A:
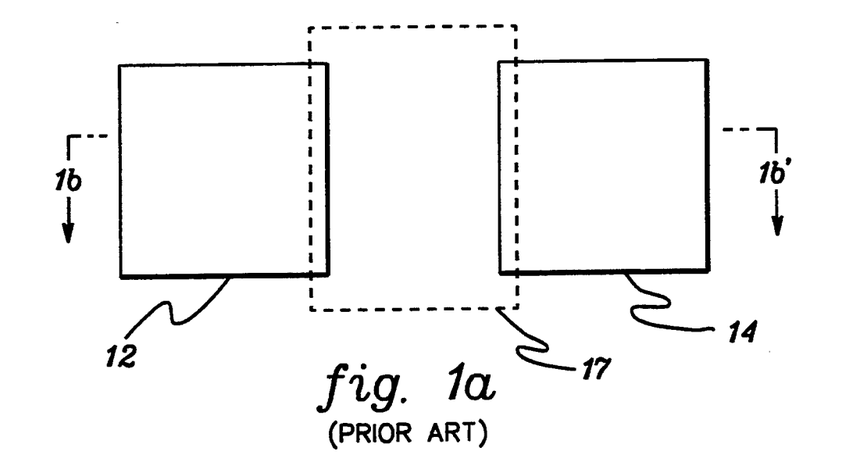
FIG. 1a is a top plan view of a conventional MOSFET layout.
Figure 1B:
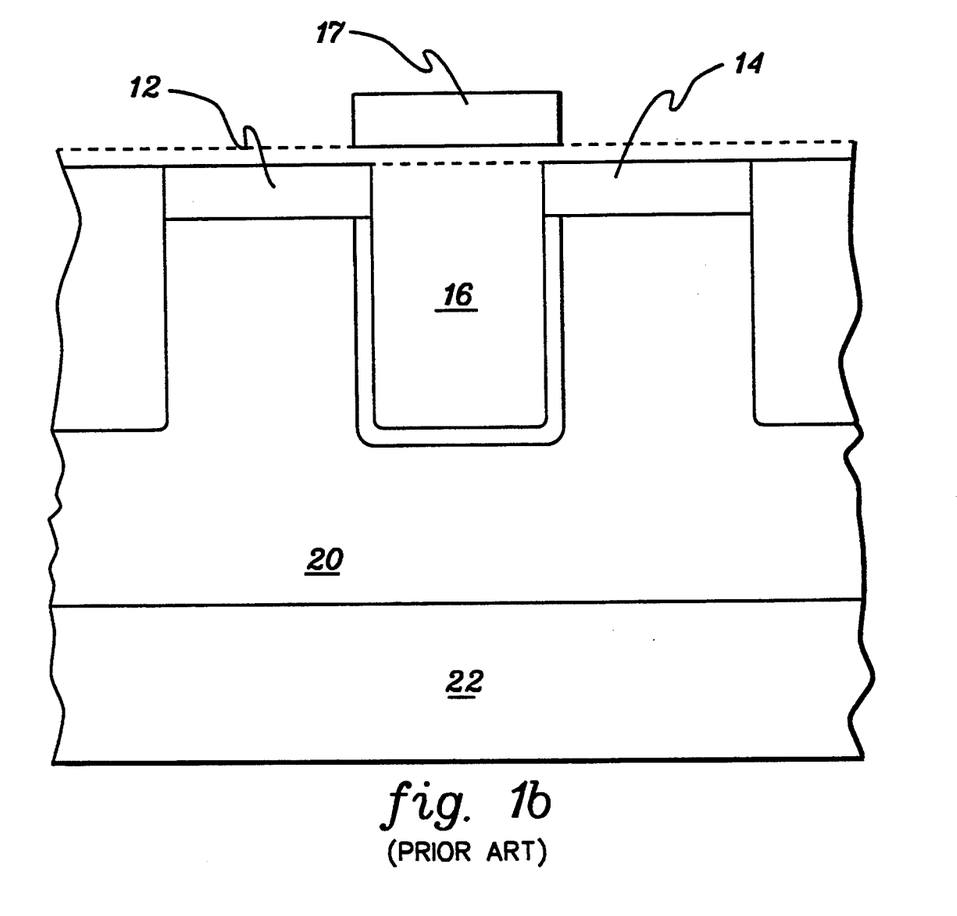
FIG. 1b is a cross-sectional elevational view of the MOSFET of FIG. 1a taken along lines 1b—1b'.
Figure 2:
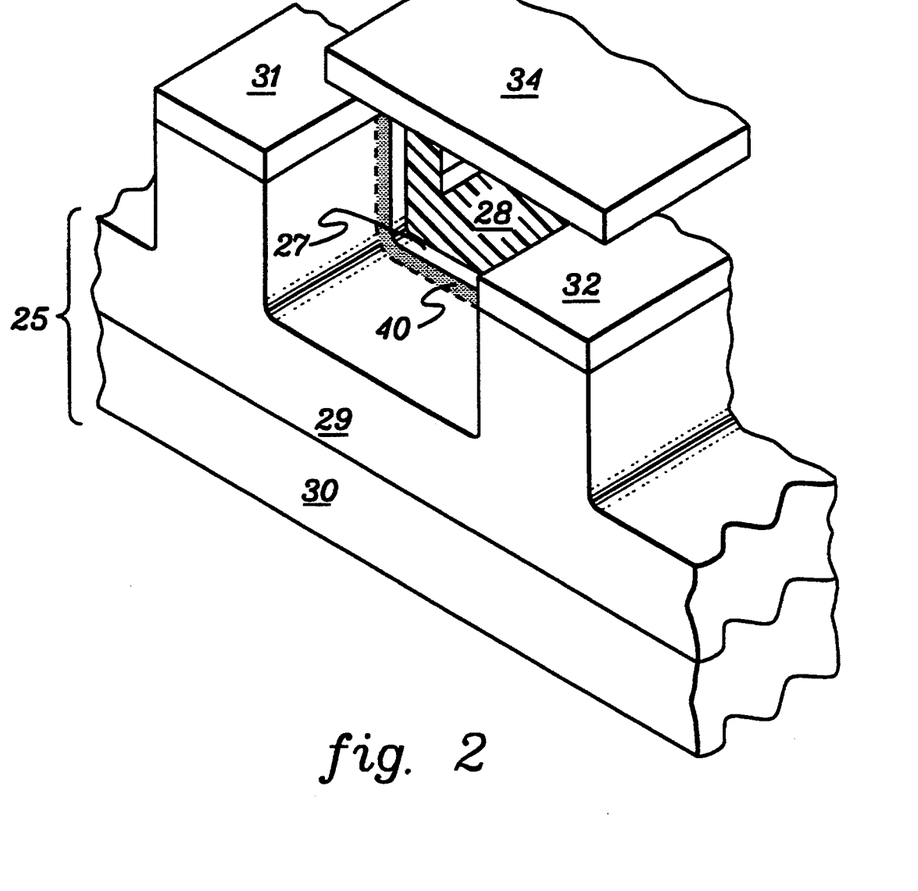
FIG. 2 is a simplified, partial perspective of a semiconductor memory structure with merged isolation and node trench (MINT) construction, showing the parasitic leakage path identified herein.
Figure 3A:
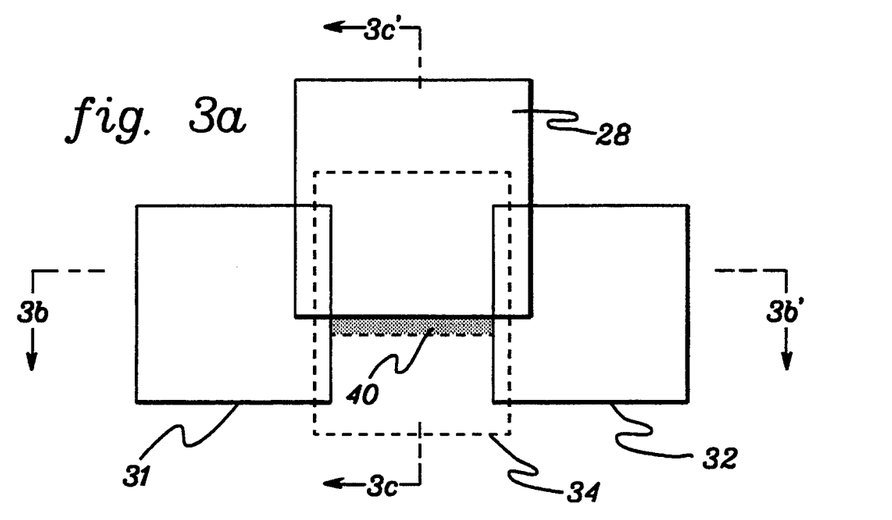
FIG. 3a is a top plan view of the semiconductor memory structure of FIG. 2.
Figure 3B:
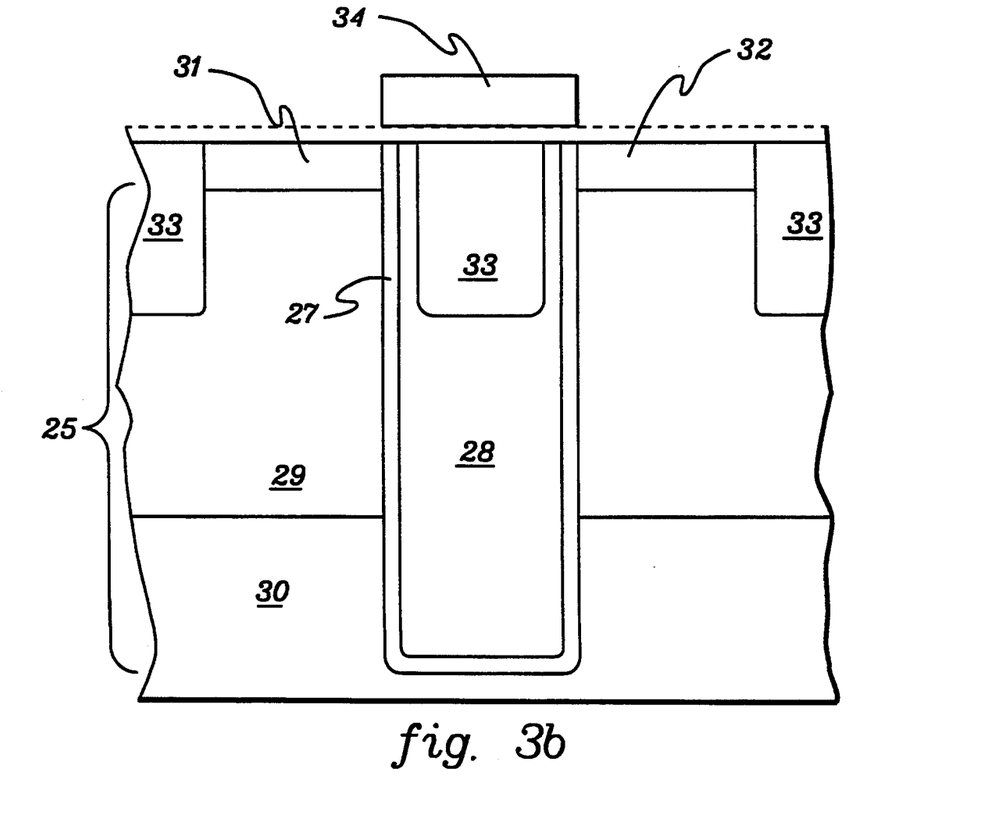
FIG. 3b is a cross-sectional elevational view of the semiconductor memory structure of FIG. 3a taken along lines 3b—3b'.
Figure 3C:
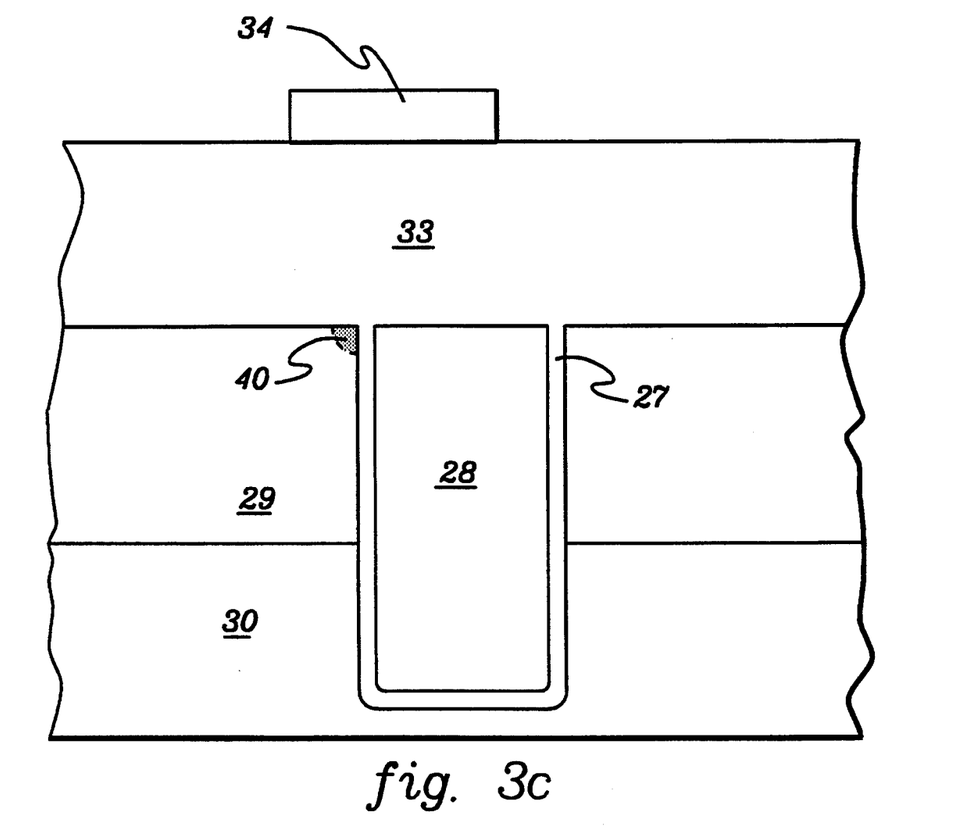
FIG. 3c is a cross-sectional elevational view of the semiconductor memory structure of FIG. 3a taken along lines 3c—3c'.

By way of example, FIGS. 1a & 1b depict one embodiment of a metal-oxide-semiconductor field-effect transistor (MOSFET), generally denoted 10, comprised of opposing source and drain regions 12 and 14, respectively. Source region 12 and drain region 14 are isolated from each other by a trench isolation oxide 16, and are isolated from an overpassing gate 17. An appropriate blocking type implant is disposed in the area beneath trench oxide 16 to define a channel stop region 20 in a substrate 22.

The channel stop implant concentration is chosen to impair formation of the parasitic thick oxide MOSFET, while at the same time minimizing impact on the electrical characteristics of the source/drain diffusions. This can be difficult, however, since heating of a semiconductor wafer during processing after forming channel stop regions can cause the implantations to migrate towards the diffusions or into the field oxide. This difficulty tends to limit the concentration of dopant in the channel stop region. One significant application for channel stop regions has been in the formation of semiconductor memory devices.

Parallel with recent exponential growth in the use of integrated circuits has come the development of numerous types of semiconductor memory devices. More particular to the present invention, memory devices have been proposed with various types of semiconductor trench and storage capacitor constructions. This invention relates to one particular type of memory construction referred to in the art as a "merged isolation and node trench" (MINT) construction. For example, reference a commonly assigned patent to D. Kenney entitled "Semiconductor Trench Capacitor Cell With Merged Isolation and Node Trench Construction, " U.S. Pat. No. 4,801,988. Practical fabrication of such devices continues to be a significant goal of the semiconductor fabrication industry. The present invention is directed to meeting this goal.

DISCLOSURE OF THE INVENTION

Briefly summarized, the present invention comprises in a first aspect a semiconductor structure including a semiconductor substrate having a charge storage trench disposed therein that is at least partially surrounded by a field isolation region that is also disposed in the semiconductor substrate. The charge storage trench and the field isolation region have an interface region wherein the charge storage trench and the field isolation region are in opposing relation. A first diffusion region and a second diffusion region are also located in the semiconductor substrate and disposed so as to be partially separated from the charge storage trench by the field isolation region proximate to the interface region. An isolation implant layer is formed in the field isolation region at the interface region of the charge storage trench and the field isolation region. The isolation implant layer is disposed and has a dopant concentration sufficient to restrict formation of an inversion layer in the field isolation region between the first diffusion region and the second diffusion region.

In another aspect, the invention comprises a semiconductor memory array including a semiconductor substrate having multiple memory cells disposed in an array configuration within the substrate. The array is accessed through multiple intersecting word lines and bit lines. Each memory cell in the array includes a charge storage trench formed within the semiconductor substrate and a field isolation region that at least partially surrounds the charge storage trench such that an interface region is created between the charge storage trench and the field isolation region wherein the charge storage trench and the field isolation region are in opposing relation. A storage node diffusion and a bit line contact diffusion are each disposed in the substrate proximate to the charge storage trench. An isolation implant layer is formed in the field isolation region at the interface region of the charge storage trench and the field isolation region and has a dopant concentration sufficient to restrict formation of an inversion layer in said field isolation region between the storage node diffusion and the bit line contact diffusion of an adjacent memory cell in the array.

In still another aspect, a method is provided for fabricating a memory structure which includes the steps of: forming a trench in a semiconductor substrate, the trench having a sidewall surface area and being formed near a field isolation region in the substrate; selectively implanting dopant into the sidewall of the trench near an upper surface of the semiconductor substrate so as to define an isolation implant layer in the substrate; forming a capacitor node in the trench; and forming a first and second diffusion region in the substrate. The first and second diffusion region are separated by the field isolation region proximate to the capacitor node formed in the trench. The isolation implant layer is disposed and has sufficient dopant concentration to restrict formation of an inversion layer within the field isolation region adjacent to the capacitor node and extending between the first diffusion region and the second diffusion region.

In a further aspect, a method for restricting formation of an inversion layer in a field isolation layer of a semiconductor memory structure having merged isolation and node trench construction is provided. The semiconductor memory structure includes a node trench, an isolation trench partially merged therewith, a first diffusion, and an adjacent second diffusion. An interface region is defined in the field isolation region at the intersection of the node trench and the isolation trench. During fabrication of the semiconductor memory structure, the method includes the steps of: implanting additional dopant into the field isolation region at the interface region, the additional dopant being of the same type material as that of the field isolation region; and driving the additional dopant into the field isolation region at the interface region to create an isolation implant layer adjacent to the node trench and the isolation trench sufficient to restrict formation of an inversion layer between the first diffusion and the adjacent second diffusion.

To restate, the present invention comprises in one aspect an improved memory structure with MINT construction, having trench isolation and method of fabrication, having longer charge storage capacity. By extending storage capacity, cell refreshing may occur at longer time periods, thereby reducing power consumption of an entire memory array. Further, a reduced amount of thermal energy is generated due to the longer storage capacity. The structure and method presented herein allow the reduction in parasitic leakage to levels which will make production level fabrication of MINT memory arrays practical. The approach applies equally to DRAMs, SRAMs, EPROMs, etc.

BRIEF DESCRIPTION OF DRAWINGS

These and other objects, advantages and features of the present invention will be more readily understood from the following detailed description of certain preferred embodiments of the invention, when considered in conjunction with the accompanying drawings in which.

BEST MODE FOR CARRYING OUT THE INVENTION

A parasitic leakage mechanism has been discovered by applicants occurring in memory arrays having merged isolation and node trench construction. The leakage mechanism is small, for example, on the order of 1 femtoamp to 1 picoamp per memory cell, but in a memory array is a significant hindrance to the goal of maintaining charge storage for a long time interval. When established, the leakage path has been discovered to extend between an adjacent bit line contact diffusion and a storage node's drain or source diffusion proximate to the storage node trench and below the isolation trench. In essence, there is a dual gating affect which is sufficient to create an inversion layer in the field isolation region (i.e., channel stop region), notwithstanding that the field isolation region is doped to prevent such an inversion layer. This is partially due to the practical limitations on doping concentrations which may be employed in the field isolation region.

Once established, the leakage path mechanism has been identified as passing in the field isolation region between the shallow isolation trench and the deep storage trench. The passing word line acts as an FET gate across the isolation oxide while the storage node operates as a gate across its own trench oxide. The strength of the dual gating is such as to create the parasitic inversion in the field isolation region of the memory cell adjacent to the storage node and below the isolation trench. In accordance with the present invention, this newly identified leakage mechanism is inhibited by the selective formation of an isolation implant layer on the deep trench sidewall in the vicinity of the isolation trench.

The parasitic leakage mechanism is established when the memory cell diffusion adjacent to the storage node is at a low potential and the bit line contact diffusion of an adjacent bit line is at a high potential such that there is a source to drain bias. A leakage current passes when there is a low voltage in the cell's storage node and the passing word line happens to also be at a low voltage, for example, when reading or writing a cell in the array. As noted, this leakage current arises at the intersection of the deep storage node, the shallow isolation trench and the passing word line. If only one of the dual gates is active low then the parasitic leakage current is believed sufficiently low so as not to be a concern, at least not today. However, the present invention also addresses such a situation, which may become important in the future.

Reference is now made to the drawings in which the same reference numbers are used throughout the different figures to designate the same or similar components.

A simplified memory structure with MINT construction is partially depicted in FIGS. 2 & 3a–3c. This memory structure includes a deep trench capacitor 28 formed in a composite semiconductor substrate 25 comprising, for example, an n-well 29 disposed in a p+ substrate 30. In the embodiments presented herein, n-well 29 functions as a field isolation region. On the sub-surface of the composite semiconductor substrate, a transistor is constructed having a source diffusion 31, a drain diffusion 32, and a gate electrode 34. Source diffusion 31 and drain diffusion 32 are separated from each other by a shallow isolation trench 33 and are separated from gate electrode 34 via a thin insulating layer disposed above the source diffusion and drain diffusion. The deep trench capacitor formed in composite substrate 25 includes a thin insulation layer 27 lining that is filled with, for example, polysilicon. Field isolation region 29 serves to separate the deep trench capacitor from adjacent deep trenches and from other structures in an array of such memory cells.

As discussed in general above, a parasitic leakage path 40 has been discovered to arise in the memory structure of FIGS. 2 & 3a–3c when a low voltage, e.g., near ground potential, is applied to trench capacitor 28 and to the polysilicon word line 34 overpassing the isolation trench oxide 33, notwithstanding the presence of field isolation region 29. In effect, line 34 and capacitor 28 establish leakage path 40 by synergistically providing the parasitic FET turn-on voltage. The path of this inversion layer 40 extends from source diffusion 31 down the sidewall of isolation trench 33 adjacent to the storage trench 28, then continues along the bottom of the isolation trench, again adjacent to the storage trench, and finally proceeds up the isolation trench sidewall to terminate at drain diffusion 32. The dual gating affect has been discovered to substantially lower the threshold voltage of the parasitic thick oxide FET device such that inversion layer 40 can often occur during normal operation of the MINT memory device. The structure and process presented herein are designed to block this leakage path without impinging on device charge transfer characteristics.

Figure 4:
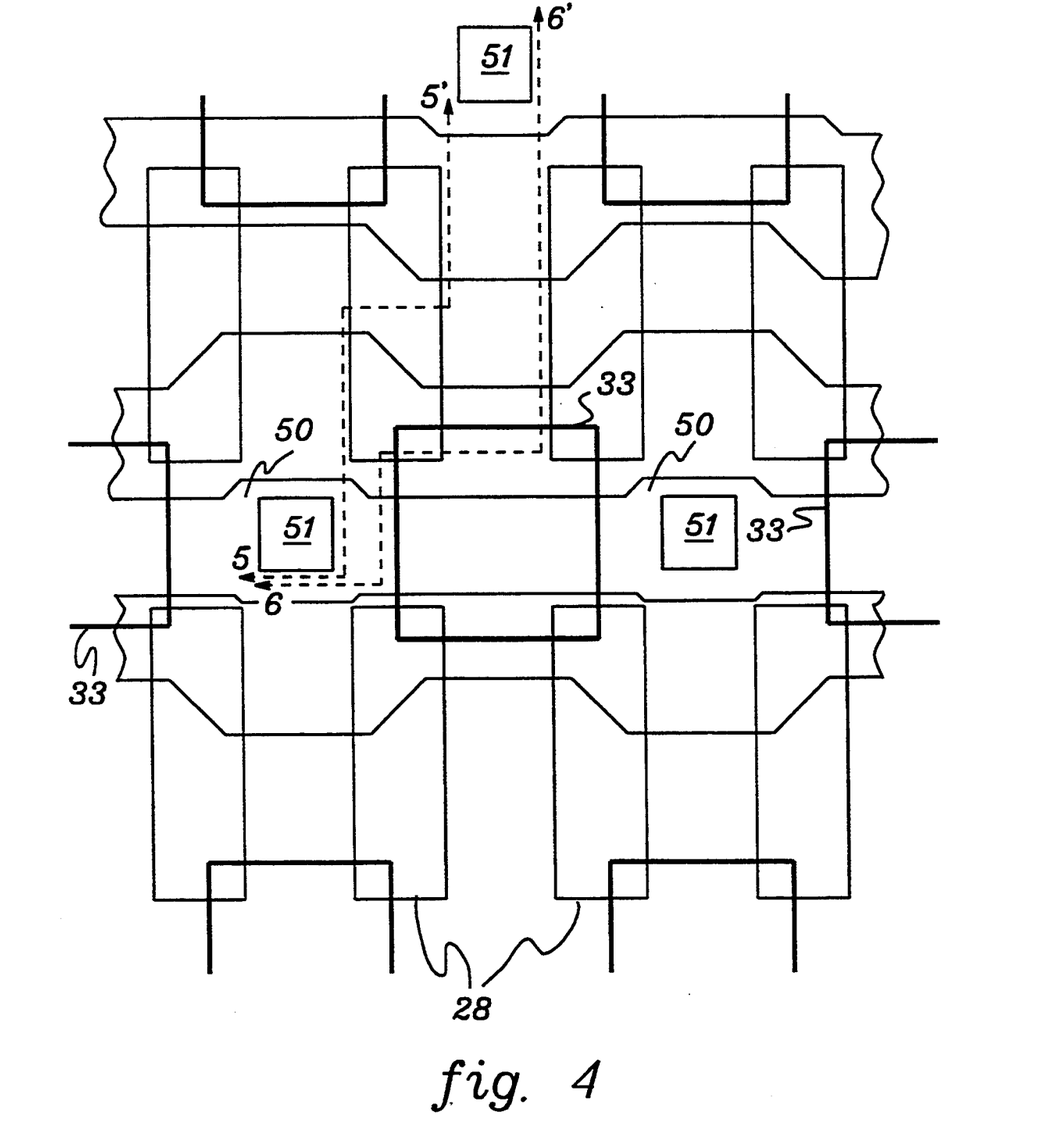
FIG. 4 is a top plan view of a dynamic random access memory (DRAM) array with merged isolation trench and node trench construction, showing the parasitic leakage path identified herein.
Figure 5:
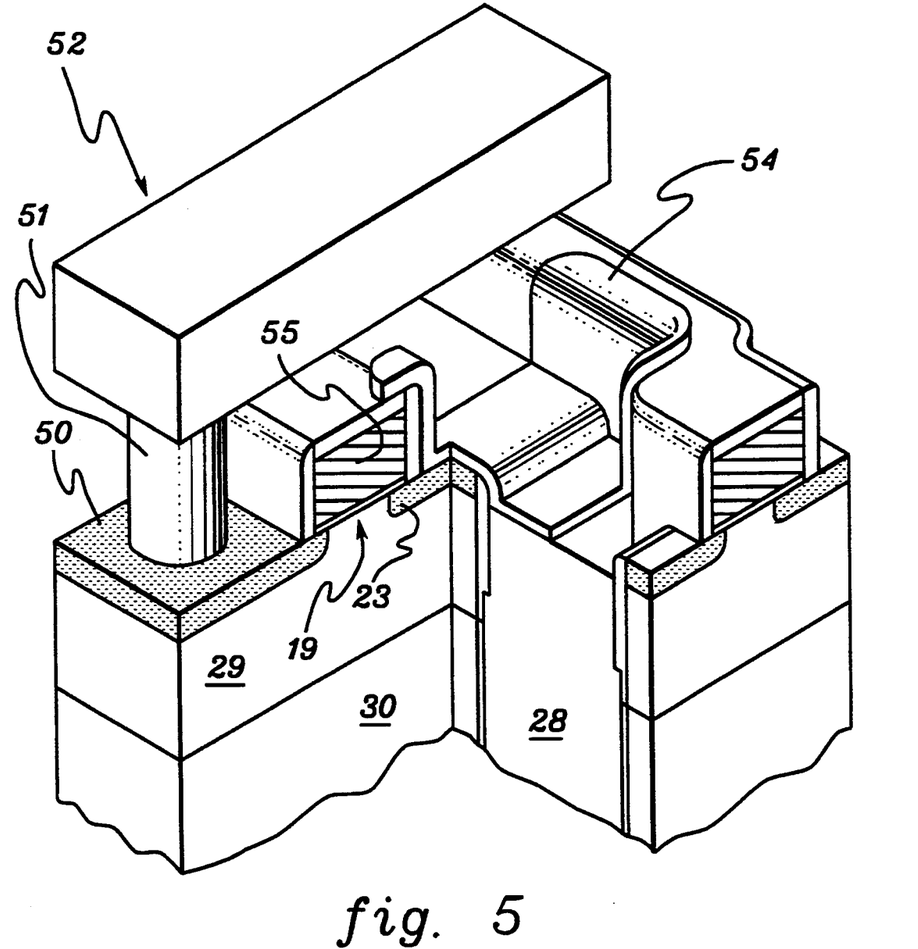
FIG. 5 is a cutaway perspective view of the dynamic random access memory array of FIG. 4 taken along lines 5—5'.
Figure 6:
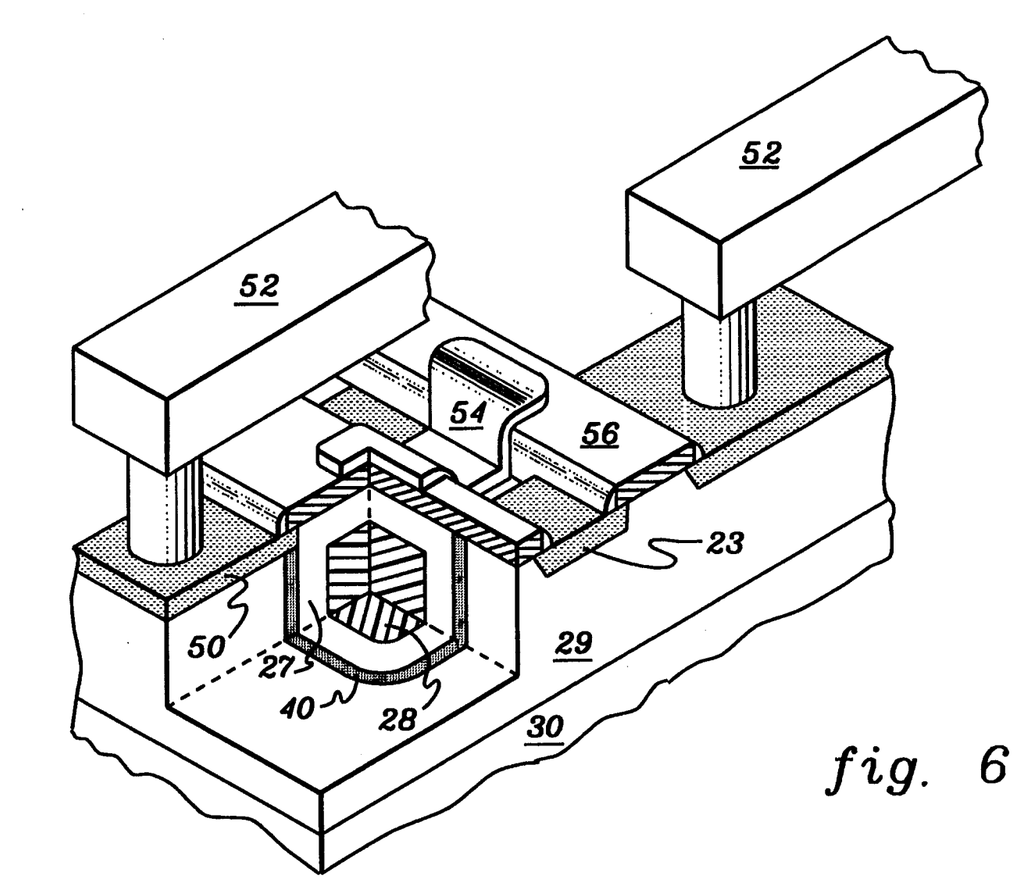
FIG. 6 is a cutaway perspective view of the dynamic random access memory array of FIG. 4 taken along lines 6—6'.

FIGS. 4–6 present in greater detail a memory array with merged isolation and node trench construction. Referring to these figures collectively, the array contains multiple bit lines 52 and word lines 56. As one example, bit lines 52 may be fabricated of aluminum, while word lines 56 might comprise a polycide composite comprising polysilicon and tungsten silicide. The deep storage node or trench capacitor, may have (for example) a depth of 10 microns from an upper surface of the substrate; and have an oxide-nitride-oxide (ONO) dielectric in the substrate region 30 and a thick oxide collar in the n-well region 29, both of which are referred to herein as trench dielectric 27. The balance of the storage node comprises, for example, polysilicon. An isolation trench 33 has a depth of approximately 0.5 microns and is filled with oxide. The function of trench 33 is to isolate and prevent crosstalk between adjacent bit lines 52 in the array.

Methods for forming the structure presented in FIGS. 4–6 can be found in commonly assigned U.S. Pat. No. 4,801,988, entitled "Semiconductor Trench Capacitor Cell With Merged Isolation and Node Trench Construction," which is hereby incorporated herein by reference. Information necessary for practice of the present invention, however, is set forth below. Note that there is some overlap with the above discussion regarding the simplified memory cell example of FIGS. 2–3c.

Each memory cell in the array is disposed within n-well 29 formed in silicon p+ substrate 30. A deep trench is created for storing charge corresponding to the memory contents of the cell. This trench is etched into substrate 30 through n-well 29. Again, the deep trench is lined with an ONO dielectric in the p+ substrate region 30 and a thick oxide collar in the n-well region 29, both of which are referred to herein as dielectric 27. p+ polysilicon fills the interior of the deep trench. A P-channel transfer device 19 has a source/drain region 50 connected to bit line 52 and another source/drain diffusion region 23 connected to the storage trench by a polysilicon surface strap 54. An inter-level oxide is deposited over the substrate material and planarized. A bit line contact 51 is etched into the inter-level oxide and the hole is filled with titanium tungsten (TiW) and planarized. Finally, aluminum is deposited and etched to form bit lines 52.

In FIG. 6, leakage path 40 is shown to comprise an inversion layer extending from source/drain diffusion 50 about the sidewall of the storage trench (and beneath the isolation trench (not shown)) up to the drain/source diffusion 23. Again, because of the dual gating by the deep trench polysilicon and the word line overpassing the isolation oxide, the threshold voltage of the parasitic thick oxide FET device is sufficiently lowered such that an inversion leakage path often occurs during operation of the memory cell, thereby affecting charge stored in the deep trench capacitor.

As noted, the solution presented herein is to selectively implant dopant species into the sidewall of the storage trench in an area designed to eliminate the parasitic thick oxide FET leakage. More specifically, during normal fabrication, deep trenches are etched into the silicon substrate, followed by growth of a sacrificial oxide on the walls and bottoms of these trenches. Pursuant to the invention, a shallow angled implant is made at the end walls of the trenches through the sacrificial oxide into the silicon substrate. A typical implantation angle might be from 30°–50°, and the dopant is implanted to a depth, for example, of less that two microns from the substrate surface. If the devices are p-channel, then any n-type material is employed, such as arsenic or phosphorous (i.e., in order that additional n-type doping is added to the n-well). If an n-channel array is desired, then p-type material is implanted into the p-well, for example, boron or indium. One embodiment for accomplishing this selective implant, is discussed below with reference to FIGS. 7–10b.

Figure 7:
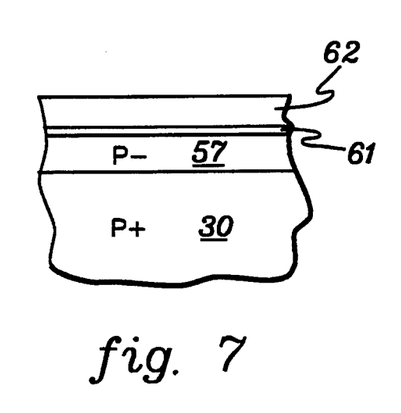
FIG. 7 is a cross-sectional elevational view of a semiconductor structure useful in describing fabrication processing in accordance with the present invention.

Beginning with FIG. 7, an oxide 61 is thermally grown atop a composite substrate comprising p+ substrate 30 and a p− substrate region 57. This thermal oxide, grown, for example, to a thickness of 15 nm, forms a pad oxide 61 and acts as a buffer between the silicon substrate and a nitride layer 62 formed thereon. Layer 62 might be formed to a thickness of 160 nm.

Figure 8:
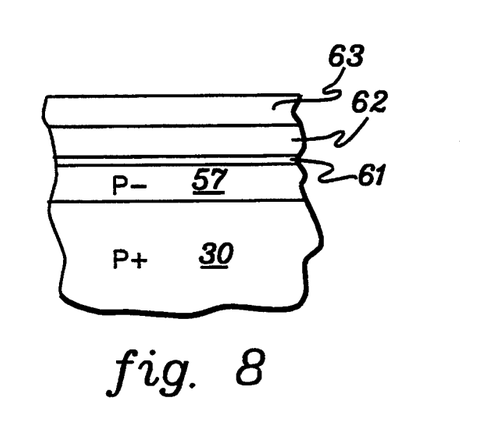
FIG. 8 is a cross-sectional elevational view of the semiconductor structure of FIG. 7 subsequent to oxide mask formation.

In FIG. 8, an oxide deposition step has been employed to create a trench mask overlay 63 above nitride layer 62. Conventional patterning with photoresist deposition, and exposing and developing of the photoresist is used to create a desired trench pattern.

Figure 9:
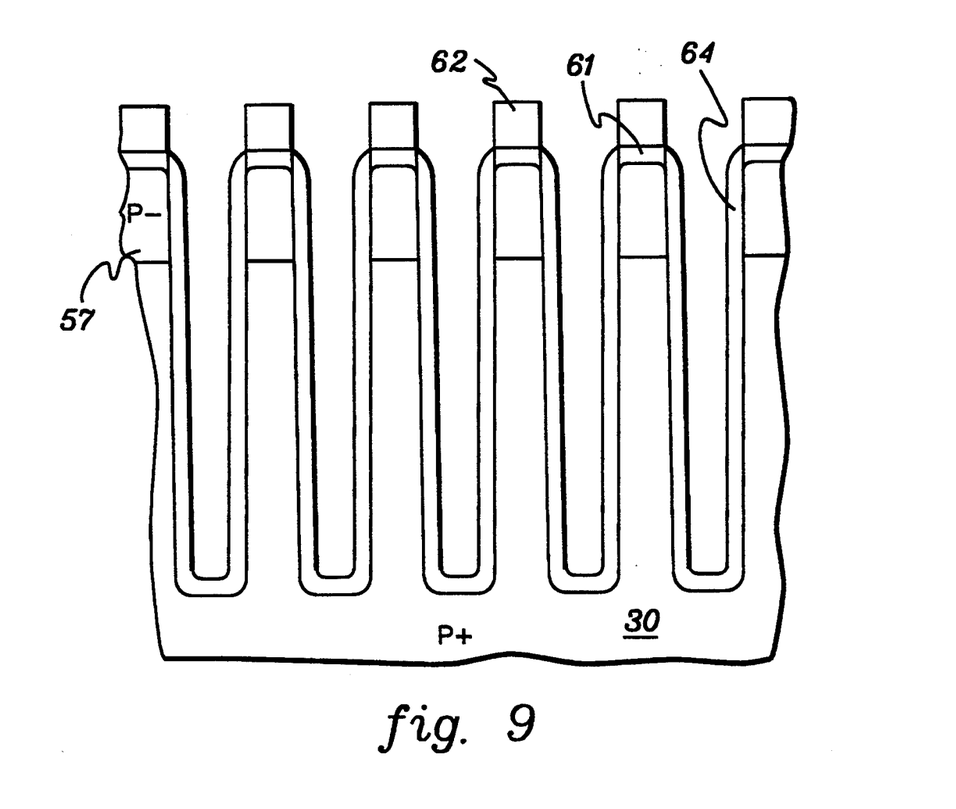
FIG. 9 is a cross-sectional elevational view of the semiconductor structure of FIG. 8 subsequent to formation of deep substrate trenches and trench screen oxide.

FIG. 9 depicts a resultant structure after trench etching through oxide mask 63 (FIG. 8), which has subsequently been removed. Again, a typical trench depth today might be 10 $\mu$m through n-well 29 into substrate 30. After trench formation, a sacrificial oxide, for example, 20 nanometers in thickness, is formed in the deep trench along the sidewalls and bottom wall. This sacrificial oxide also functions as a trench screen oxide 64.

Figure 10A:
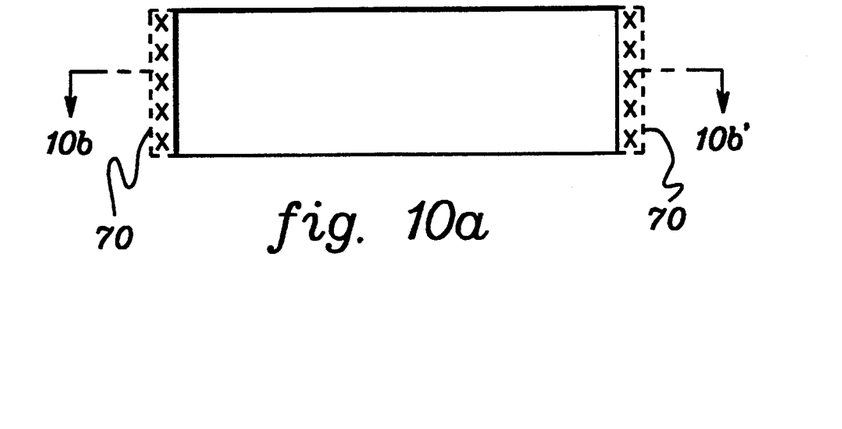
FIG. 10a is a top plan view of a charge storage trench in accordance with the present invention for a memory structure of MINT construction, showing disposition of an isolation implant layer (indicated by 'x's) at opposite ends of the charge storage trench.
Figure 10B:
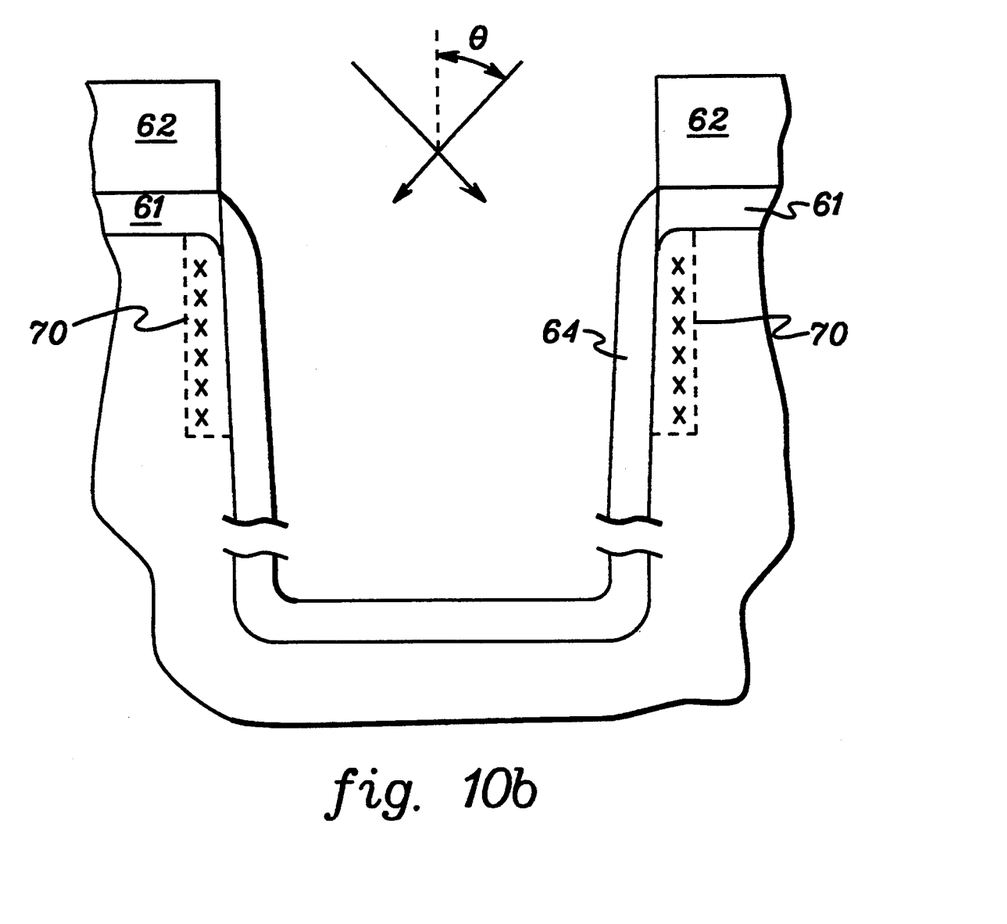
FIG. 10b is a partial cross-sectional elevational view of the charge storage trench of FIG. 10a showing angled implantation of additional species into the field isolation region of the semiconductor structure to create the isolation implant layer.

One embodiment of species implantation in accordance with the present invention is best shown in FIGS. 10a & 10b. In this implantation, additional dopant is angle implanted into opposite ends of the storage trenches so as to create isolation implant layers at opposite ends of the storage node below the associated isolation trenches. This dopant is only implanted in an upper portion of opposing ends of the storage trench(es), e.g., to a depth of 2 $\mu$m, and is of sufficient concentration to interfere with establishing of the inversion layer 40 discussed herein above, while not impinging upon the charge transfer characteristics of the polysilicon yet to be formed in the deep trench. An angle implant can be employed to selectively place the dopant as presented. By way of example, an implant angled 50° tilt relative to the semiconductor wafer surface with a dose of 1.25 E12/cm$^2$ arsenic at 140 KeV can be used to create a thin N-type arsenic isolation layer 70 on the trench end walls. Opposite end walls are implanted by rotating the wafer 180° between implants.

As shown by the placement of 'x's in FIG. 10a, the longer sidewall portions of the storage trench are preferably not implanted so as to minimize impact on electrical characteristics of the transfer device. During implant, pad nitride 62 acts as an implant mask to prevent the top surface of the silicon from being implanted. The implant angle is chosen such that the implant will be self-aligned into the P-region (n-well) 29 and will not be implanted into the p+ substrate region 30. Implantation occurs through the trench oxide screen 64 which advantageously functions to filter impurities from reaching the silicon substrate. At a subsequent processing step, the P-region in the memory cell region can be counter-doped with a phosphorus implant to create the conventional n-well 29 for base control of thick oxide FET leakage and latch up. Once the thin isolation layer 70 is formed, processing proceeds in a well known manner for fabrication of a MINT memory array.

To restate, the present invention comprises in one aspect an improved memory structure with MINT construction and method of fabrication, having longer charge storage capacity. By extending storage capacity, cell refreshing may occur at longer time periods, thereby reducing power consumption of an entire memory array. Further, a reduced amount of thermal energy is generated due to the longer storage capacity. The structure and method presented herein allow the reduction in parasitic leakage to levels which will make production level fabrication of MINT DRAM arrays practical. Further, the approach is equally applicable to DRAMs, SRAMs, EPROMs, etc.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

We claim:

1. A semiconductor structure comprising:

a semiconductor substrate;

a charge storage trench in said semiconductor substrate;

a field isolation region in said semiconductor substrate, said field isolation region at least partially surrounding said charge storage trench such that said charge storage trench and said field isolation region have an interface region wherein said charge storage trench and said field isolation region are in opposing relation;

a first diffusion region in said semiconductor substrate, said first diffusion region being at least partially separated from said charge storage trench by said field isolation region proximate to said interface region;

a second diffusion region in said semiconductor substrate, said second diffusion region being at least partially separated from said charge storage trench by said field isolation region proximate to said interface region; and a vertical isolation implant layer formed in said field isolation region at said interface region of said charge storage trench and said field isolation region, said vertical isolation implant layer extending vertically along only two opposing sidewalls of said charge storage trench, said vertical isolation implant layer being disposed and having a dopant concentration sufficient to restrict formation of an inversion layer in said field isolation region at said interface region between said first diffusion region and said second diffusion region.

2. The semiconductor structure of claim 1, further comprising an isolation trench disposed adjacent to said charge storage trench, said interface region of said charge storage trench and said field isolation region being located at least partially beneath said isolation trench.

3. The semiconductor structure of claim 2, wherein said charge storage trench comprises a deep trench in said semiconductor substrate and said isolation trench comprises a shallow trench in said semiconductor substrate.

4. The semiconductor structure of claim 3, wherein said semiconductor structure comprises a dynamic random access memory structure of merged isolation trench and charge storage trench construction.

5. The semiconductor structure of claim 1, wherein said field isolation region comprises a channel stop region of a first-type material, and wherein said vertical isolation implant layer also comprises a layer of said first-type material, said first-type material comprising either n-type material or p-type material.

6. The semiconductor structure of claim 1, wherein said charge storage trench extends into said semiconductor substrate a depth 'x' from an upper surface of said semiconductor substrate, and wherein said vertical isolation implant layer extends into said field isolation region in the semiconductor substrate a depth 'y' from the upper surface of the semiconductor substrate, wherein 'y'<'x'.

7. The semiconductor structure of claim 6, wherein said depth 'y' of said isolation implant layer is in a range of 5–30 percent of said depth 'x' of said charge storage trench.

8. The semiconductor structure of claim 1, wherein said vertical isolation implant layer is located in said interface region at only said two opposing sidewalls of the charge storage trench without interfering with charge transfer characteristics of said charge storage trench.

9. The semiconductor structure of claim 1, wherein said charge storage trench comprises a capacitor trench having an outer dielectric layer surrounding an inner storage node, said inner storage node being separated from said vertical isolation implant layer in said interface region by said outer dielectric layer.

10. The semiconductor structure of claim 1, wherein said charge storage trench has an elongated cross-section parallel to an upper surface of said semiconductor substrate, said elongated cross-section of said charge storage trench having a first end and a second end, and wherein said interface region is disposed in said field isolation region at only said first end and said second end.

11. The semiconductor structure of claim 1, wherein said semiconductor structure comprises a memory structure and said first diffusion region comprises a storage node diffusion that functions either as a source node or a drain node for said memory structure.

12. The semiconductor structure of claim 11, wherein said second diffusion region comprises a bit line contact diffusion.

13. The semiconductor structure of claim 12, further comprising an isolation trench disposed adjacent to said charge storage trench, said interface region of said charge storage trench and said field isolation region being located at least partially beneath said isolation trench, said charge storage trench comprising a deep trench in said semiconductor substrate and said isolation trench comprising a shallow trench in said semiconductor substrate.

14. A semiconductor memory array comprising:
a semiconductor substrate;
multiple memory cells disposed in an array within said semiconductor substrate, said array being accessed by multiple intersecting word lines and bit lines, each memory cell comprising
a charge storage trench in said semiconductor substrate,
a field isolation region in said semiconductor substrate, said field isolation region at least partially surrounding said charge storage trench such that said charge storage trench and said field isolation region have an interface region wherein said charge storage trench and said field isolation region are in opposing relation,
a storage node diffusion in said semiconductor substrate, said storage node diffusion being at least partially separated from said charge storage trench by said field isolation region proximate to said interface region,
a bit line contact diffusion in said semiconductor substrate, said bit line contact diffusion being coupled to an associated bit line of said multiple intersecting word lines and bit lines, and
a vertical isolation implant layer formed in said field isolation region at said interface region of said charge storage trench and said field isolation region, said vertical isolation implant layer extending only along two Opposing sidewalls of said charge storage trench, said vertical isolation implant layer being disposed and having a dopant concentration sufficient to restrict formation of an inversion layer in said field isolation region between said storage node diffusion and the bit line contact diffusion of an adjacent memory cell in the array.

15. The semiconductor memory array of claim 14, wherein for each memory cell, said vertical isolation implant layer is disposed in only a portion of said interface region to not interfere with charge transfer characteristics of the charge storage trench, while still restricting formation of said inversion layer in said field isolation region adjacent to said charge storage trench and adjacent to an associated world line of said multiple intersecting word lines and bit lines in the array.

16. The semiconductor memory array of claim 14, wherein each memory cell further comprises an isolation trench disposed in said semiconductor substrate at least partially above said interface region such that said semiconductor memory array comprises a memory array having merged isolation trench and charge storage trench construction.

17. The semiconductor memory array of claim 16, wherein for each memory cell, said isolation trench comprises a shallow trench and said charge storage trench comprises a deep trench.

18. The semiconductor memory array of claim 17, wherein for each memory cell, said charge storage trench has a trench sidewall surface area and wherein said vertical isolation implant layer has a trench sidewall implant area, said trench sidewall implant area comprising a fraction of said trench sidewall surface area such that the vertical isolation implant layer formed in the field isolation region at the interface region does not adversely impinge upon charge transfer characteristics of the charge storage trench.

19. The semiconductor memory array of claim 18, wherein for each memory cell, the charge storage trench extends into the semiconductor substrate a depth 'x' from an upper surface of the semiconductor substrate and the vertical isolation implant layer extends into the field isolation region in the semiconductor substrate a depth 'y' from the upper surface of the semiconductor substrate, wherein 'y'<'x'.

20. The semiconductor memory array of claim 16, wherein for each memory cell, the field isolation region comprises a channel stop region of a first-type material, and the vertical isolation implant layer also comprises a layer of the first-type material, said first-type material comprising either n-type material or p-type material.

21. The semiconductor memory array of claim 14, wherein for each memory cell, the charge storage trench has a first end and a second end, and wherein said vertical isolation implant layer is disposed in said field isolation region adjacent to only said first end and said second end.

* * * * *